United States Patent [19]

Liu et al.

[11] Patent Number: 5,097,155
[45] Date of Patent: Mar. 17, 1992

[54] SWITCHED-CURRENT DIFFERENTIATORS AND FILTERS

[75] Inventors: Shen-Iuan Liu, Keelung; Jing-Shown Wu; Hen-Wai Tsao, both of Taipei, all of Taiwan

[73] Assignee: Industrial Technology Research Institute, Taiwan

[21] Appl. No.: 653,783

[22] Filed: Feb. 13, 1991

[51] Int. Cl.$^5$ .............................................. H03K 5/00
[52] U.S. Cl. .................................... 307/490; 328/127
[58] Field of Search ................ 307/261, 490; 328/127, 328/128; 364/828

[56] References Cited

U.S. PATENT DOCUMENTS 4,746,871  5/1988  de la Plaza ........................... 328/127
4,918,338  4/1990  Wong ................................ 328/127 X

OTHER PUBLICATIONS

Yu et al., "Realizations of IIR/FIR and N-Path Filters Using a Novel Switched Capacitor Technique", IEEE Trans. on Circts. and Systs., vol. 37, No. 1, Jan. 1990, pp. 91-106.

Wu et al., "New Monolithic Switch-Capacitor Differentiators with Good Noise Rejection", IEEE Journal of Sol. St. Circs., vol. 24, No. 1, Feb. 1989, pp. 177-180.

Primary Examiner—Robert J. Pascal
Attorney, Agent, or Firm—H. C. Lin

[57] ABSTRACT

Switched current differentiators are used as the basic building blocks for discrete time signal processing to implement filters, biquads and high order ladder networks. These circuits can readily be implemented with MOS technology.

10 Claims, 10 Drawing Sheets

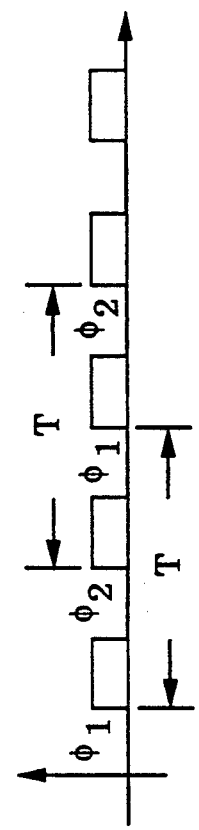
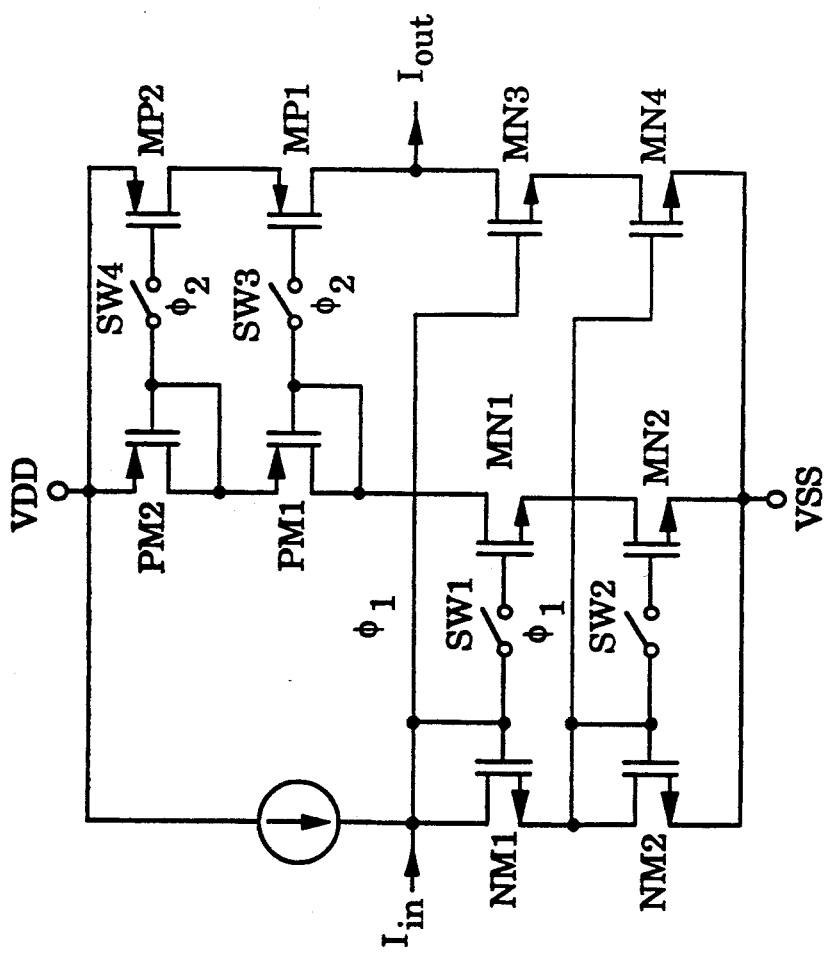
Fig. 4(a)
Fig. 4(b)
Fig. 4(c)

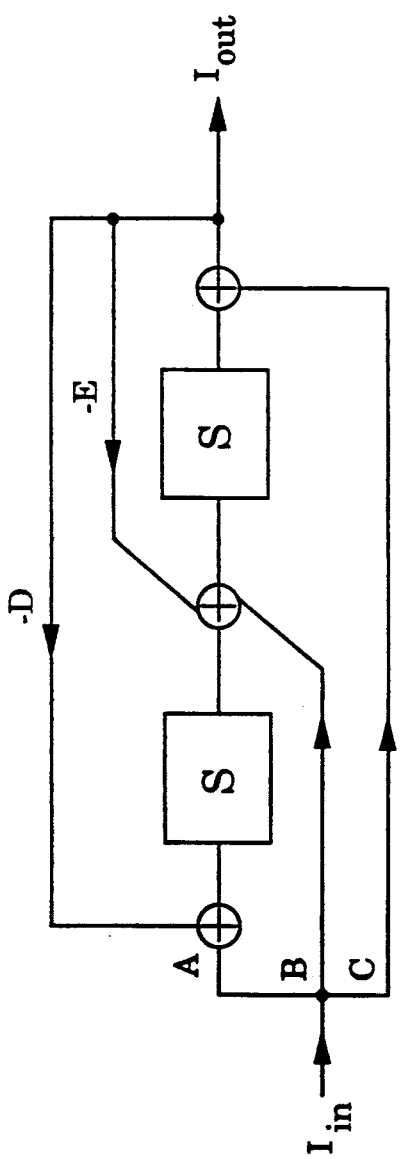
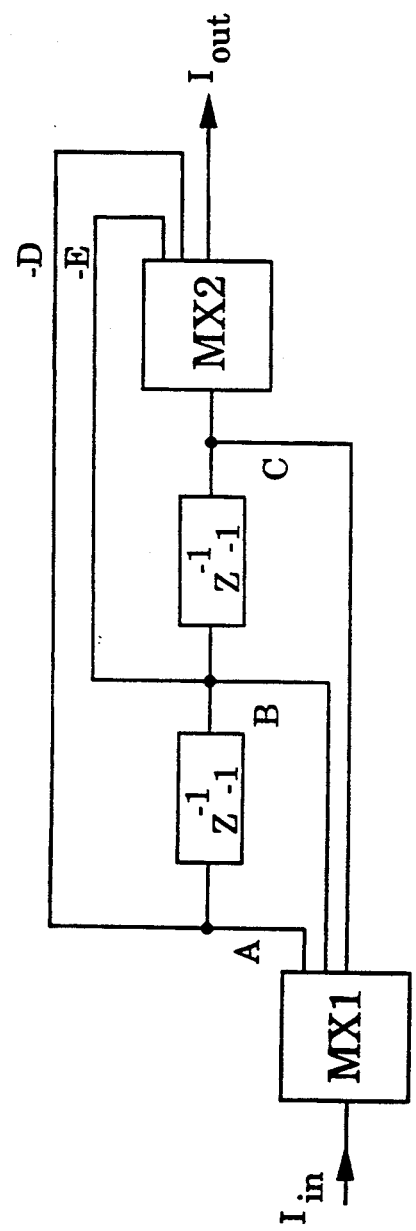
Fig. 8(a)
Fig. 8(b)

SWITCHED-CURRENT DIFFERENTIATORS AND FILTERS

FIELD OF INVENTION

This invention relates to circuits and filters for MOS technology, particularly for use in analog signal processing.

BACKGROUND OF THE INVENTION

Switched capacitor (SC) circuit technique is widely used in analog sampled-data signal processing applications today. There are a number of advantages: (a) The switched capacitors can replace large valued resistors which are not readily integrable. (b) The ratio of capacitance can be controlled better than the ratio of resistance in integrated circuits (IC). Thus, the SC integrator has been widely used as a basic building block to replace the conventional integrator with an input resistance and a capacitance feedback around an operational amplifier in MOS ICs. However, capacitors occupy relatively large area in an IC.

Another basic building block for filter design is the differentiator. In a paper entitled: "Realization of IIR/-FIR and N-path filters using novel switched-capacitor technique", published in the IEEE Transactions on Circuits and Systems, volume CAS-37, pp. 91-106, Jan. 1990, the authors T. C. Yu, C. Y. Wu and S. S. Chang described how differentiators can be used as basic building blocks for filter designs. The structures have the advantages of being simple, parasitic free and less sensitive to offset voltages and power supply voltage changes. However, the scheme uses switched capacitors, which again occupy relatively large IC areas.

There is another class of circuits known as the switched current (SI) circuit, which does not require any external capacitors. The basic circuit is shown in FIG. 1. It is a complementary pair of current mirrors. The input current and the output current of this complementary current mirror are sequentially switched.

In FIG. 1, NM and MN are n-channel MOS transistors (MOSFET). NM is connected as an MOS diode with the gate and the drain short-circuited. The input current Iin and the constant current source In are fed to the common gate and drain terminal of NM. The magnitude of In should exceed the magnitude of any possible negative Iin, so the MOS diode is never reverse biased. This common gate and drain of NM is connected to the gate of the mirroring MOSFET MN through a switch SW1. The sources of NM and MN are connected together to the negative dc power supply, say the ground. When SW1 is closed by a clock pulse $\phi 1$, the circuit becomes a current mirror in that the drain current of MN, IDN, mirrors the current Iin+In, as is well-known in the art.

The mirrored drain current IDN is fed to another complementary current mirror with p-type channel MOSFET PM and MP. This complementary current mirror is a dual of the n-channel MOSFET current mirror. As before, PM is connected as an MOS diode with the drain and the gate short-circuited. This common drain and gate terminal of PM is connected to the gate of the mirroring MOSFET MP through a switch SW2, which is controlled by a clock pulse $\phi 2$. The drain of MP is connected to a load RL. When SW2 is closed, the drain current of MP is the mirror current IDN.

In operation, $\phi 1$ and $\phi 2$ are sequentially switched and non-overlapping. When SW1 is first closed, the drain current IDN is caused to mirror the current Iin+In, and to flow into PM. When SW1 is then opened, IDN continues to flow, because the gate capacitance of MN retains the gate charge and holds the gate voltage of MN constant until SW1 is closed again. Next, when SW2 is closed, the current IDN is mirrored as IL to flow into RL. Thus, after two time steps, the output current mirrors the current Iin+In. The drain current IL continues to flow even after SW2 is opened, because the gate capacitance of MP can hold the gate charge until SW2 is closed again.

The feature of this switched current circuit is that there is no capacitor used, and the circuit, together with the switches, is composed of only MOSFETs. Therefore, the circuit can be fabricated in an IC and occupies very small area. However, up to now, the SI circuit has not been utilized in filter designs, and in particular, for filter designs based on differentiators.

SUMMARY OF THE INVENTION

The object of this invention is to use a switched current circuit to implement a differentiator suitable for integrated circuits. Another object of this invention is to use the switched current differentiator as a building block for filter designs. Still another object of this invention is to use the switched current differentiator to realize a whole family of discrete time filters, including infinite impulse response filters (IIR), finite impulse response filters (FIR), second order filters (biquad) and ladder filters. A further object of this invention is to implement filters for integrated circuits, which are simple, concise and parasitic free.

These objects are realized in this invention by constructing a differentiator with a switched current circuit, thereby eliminating the use of capacitors. In the differentiator, the current of one time step subtracts the current of a previous time step to obtain a current difference. When this current difference is divided by the time increment, the quotient is the derivative of the current. Thus a differentiator is realized.

BRIEF DESCRIPTION OF THE DRAWINGS

FIG. 4(a) shows a more refined switched current differentiator circuit of this invention.

FIG. 4(b) shows the symbol of a switched differentiator shown in FIG. 4(a).

FIG. 4(c) shows the two-phase clock waveform of a switched current differentiator.

FIG. 8(a) shows the block diagram of a generalized second-order filter.

FIG. 8(b) shows the corresponding SI biquad filter shown in FIG. 8(a) using SI differentiators.

DETAILED DESCRIPTION OF THE PREFERRED EMBODIMENT

In analog sampled-data signal processing systems, the signals are sampled at discrete time instances. The filters for such systems are known as discrete time filters instead of the continuous time filters for signals, which are continuous functions of continuous time variable.

The impulse response H is often expressed in terms of z-transformation, which is defined as follows:

$$H(z) = \sum_{n=-\infty}^{\infty} + (n) z^{-n} \quad (1)$$

where f(n) is the response at time step n. This discrete time response is related to the continuous time response of radian frequency $\omega$ by the following relationship:

$$s = j\omega = (1 - z^{-1})/T \quad (2)$$

where T is the time step. Since the derivative of a sine wave signal is proportional to the frequency (e.g. $d(\sin\omega t)/dt = \omega\cos\omega t$), the function $z^{-1}$ in equation (1) represents a discrete time differentiator.

In this invention, differentiators are used as basic elements for realizing discrete time filters. The advantages of using differentiators as basic elements have been explained in a paper, "New Monolithic Switched Capacitor Differentiators with Good Noise Rejection," published in the 1989 IEEE Journal of Solid State Circuits, Vol. 24, pp. 177-180., by C. Y. Wu, T. C. Yu and S. S. Chang. In this paper, it is proven that the differentiators are simple, parasitic free and less sensitive to offset voltage and power supply variations.

Figure 2:
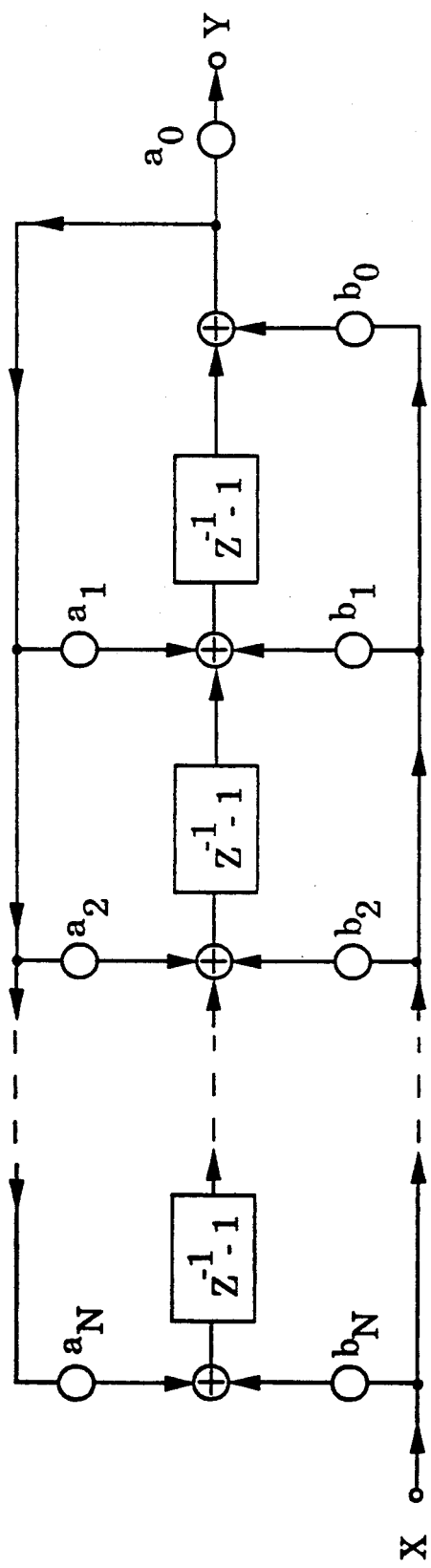
FIG. 2 shows the block diagram of a generalized recursive filter.

When differentiators are used as basic building blocks, the transfer function H(z) between the input and the output can be expressed as $$H(z) = \frac{-b_0 + \sum_{k=1}^{N} b_k(z^{-1} - 1)^k}{a_0 - \sum_{k=1}^{N} a_k(z^{-1} - 1)^k} \quad (3)$$

where b's and a's are constants representing the amplitude of the signal and k represents different time steps. This equation can be expressed as a block diagram as shown in FIG. 2. It consists of differentiator-type elements $z^{-1} - 1$, coefficient multipliers a's and b's, and adders with the symbol of an encircled + sign.

Figure 3A:
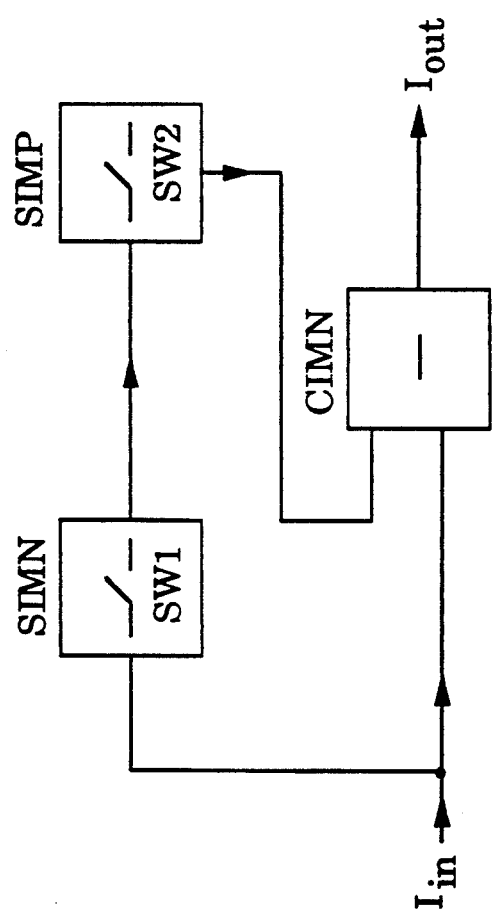
FIG. 3(a) shows the basic block diagram of this invention.

In this invention, these three basic blocks are implemented with the switched current technique. FIG. 3(a) shows a block diagram of a basic switched current differentiator. In this diagram, the block SIMN represents a switched current mirror similar to that using NM and MN in FIG. 1. The block SIMP represents a complementary switched current mirror similar to that using PM and MP in FIG. 1. After two clock pulses $\phi 1$ and $\phi 2$, the output current from block SIMP delivers a current I(n−1), which mirrors the current Iin+In two clock pulses earlier. This I(n−1) continues to flow even after $\phi 2$ is turned off as explained earlier. Meanwhile, another current mirror CIMN using MOSFET MN3 to mirror the current Iin+In continuously as an output current I(n). This current I(n) is subtracted from the current I(n−1), which mirrors the current one time step earlier. Then, the output current $$Io(s) = A[I(n-1) - I(n)] = A\Delta I \quad (4)$$

where A is a scaling factor. When this current is divided by the time step $\Delta T$, the quotient is the derivative $\Delta I / \Delta T$. Thus a differentiation step is implemented.

Figure 1:
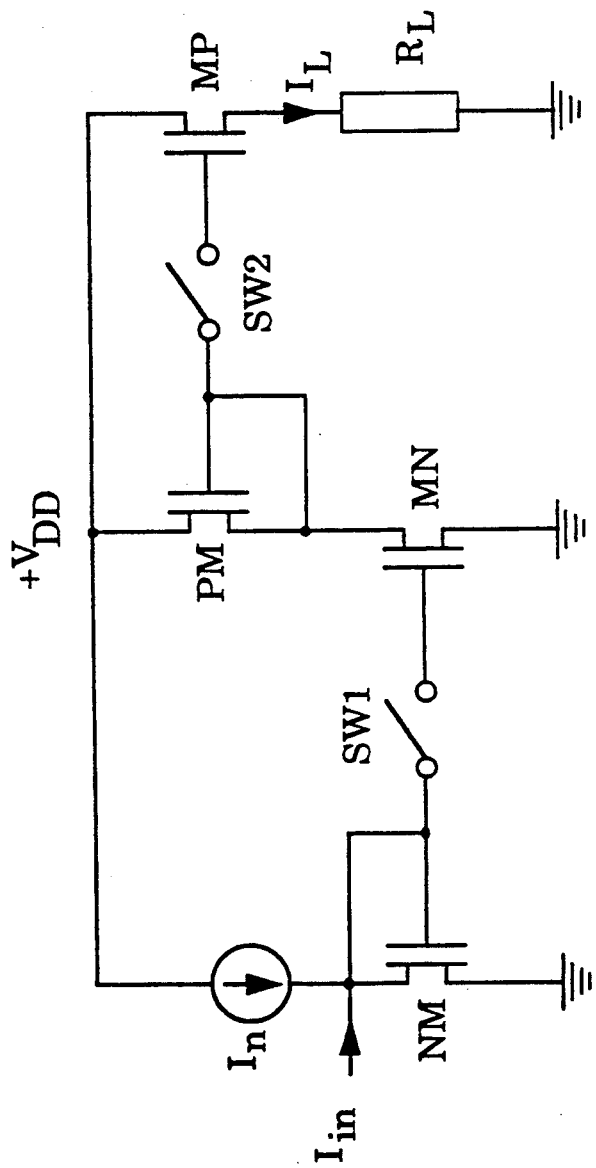
FIG. 1 shows the basic switched current circuit for this invention.

FIG. 3(a) can be implemented with the SI circuit shown in FIG. 1. In this circuit, another n-channel MOSFET MNC is used as the load of MP. MNC is the continuous current mirror CIMN shown in FIG. 3(a).

Figure 3B:
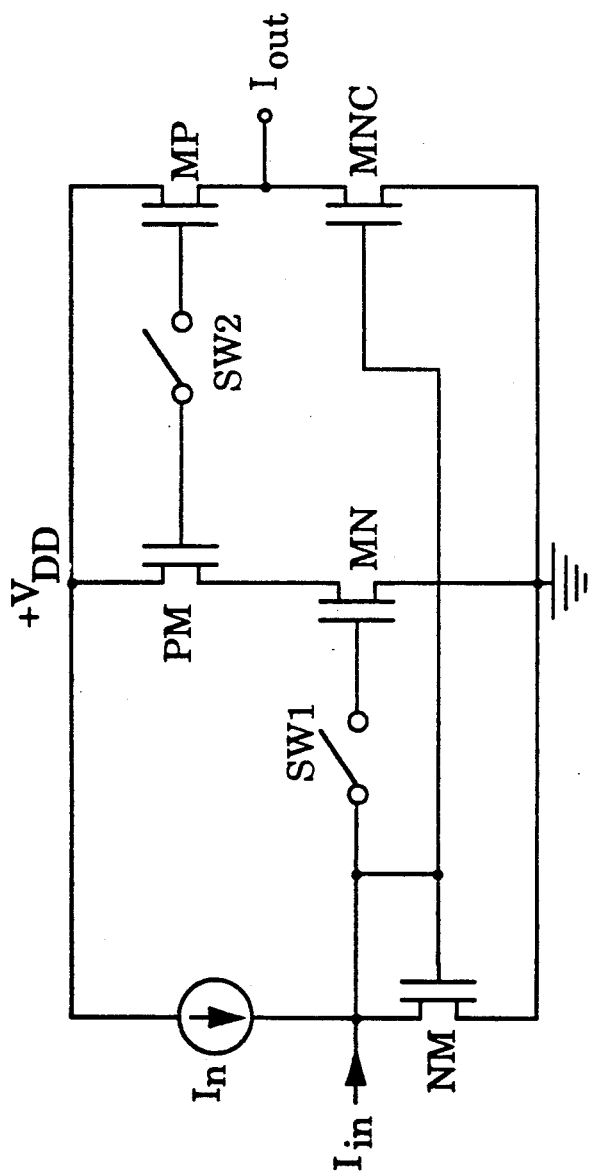
FIG. 3(b) shows the basic switched current differentiator circuit of this invention.

The block diagram shown in FIG. 3(a) can also be implemented with a circuit shown in FIG. 4(a). This circuit is a modified version of the basic circuit shown in FIG. 3(b) by using the so-called "cascode current source." In this circuit, there are two MOS diodes NM1 and NM2 connected in series. There are also two MOSFETs MN1 and MN2 to mirror the current Iin+In, when the switch SW1 is closed by clock pulse $\phi 1$. This type of current mirror can better replicate the input current, because the drain of MN2 is clamped to a low voltage, equal to the diode voltage drop across NM2, and thus the high voltage Early effect which may adversely increase the drain current is avoided. The switched complementary current mirror SIM2, using PM1, PM2, MP1, MP2, is also a cascode current mirror using p-channel MOSFETs. In a similar manner, the continuous current mirror CIM also has two MOSFETs MN3, MN4 connected as a cascode current source. The symbol for such a differentiator is shown in FIG. 4(b) and labeled as BD.

Figure 5A:
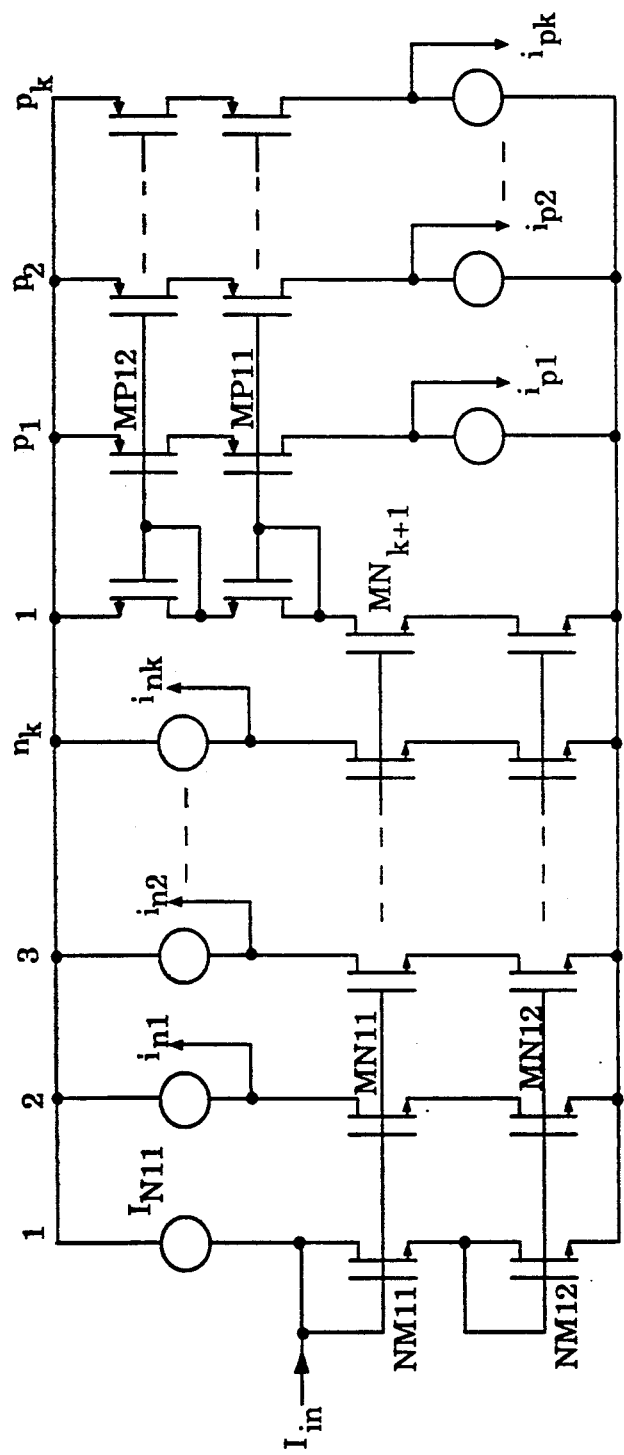
FIG. 5(a) shows a current multiplexer circuit.
Figure 5B:
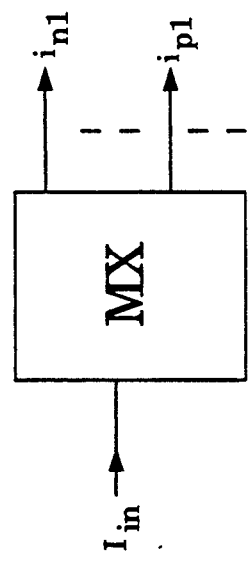
FIG. 5(b) shows the symbol of FIG. 5(a).

The multiplier coefficients ak and bk in Equation (3) can be realized by a current multiplexer shown in FIG. 5(a). The symbol is shown in FIG. 5(b). The current multiplexer consists of many branches of current mirrors connected in parallel. These branches are arranged in columns n1, n2, ... nk, using n-channel MOSFETs as current mirrors, and columns p1, p2, ... pk, using p-channel MOSFETs as current mirrors. Each column such as n1 has two MOSFETs MN11, MN12 connected in series as a cascode current mirror to cause a mirrored current ID11 to flow toward a current source In11. The output current In1 is then equal to the difference ID11−In11. The current mirror MOSFETs are weighted by using appropriate geometry to yield an output current In1 equal to a1 in Eq. 3. Similarly, the columns p1, p2, ... pk are complementary current mirrors using p-channel MOSFETs and current sources such as MP11, MP12 and Ip11 respectively, and yielding output currents Ip1, Ip2, ... Ipk, equal to the difference between sources and the drain currents. These output currents are used as b1, b2, ... bk in Eq. 3. The input current to the complementary current mirror flows from the n-channel current mirror $MN_{k+1}$.

Figure 6:
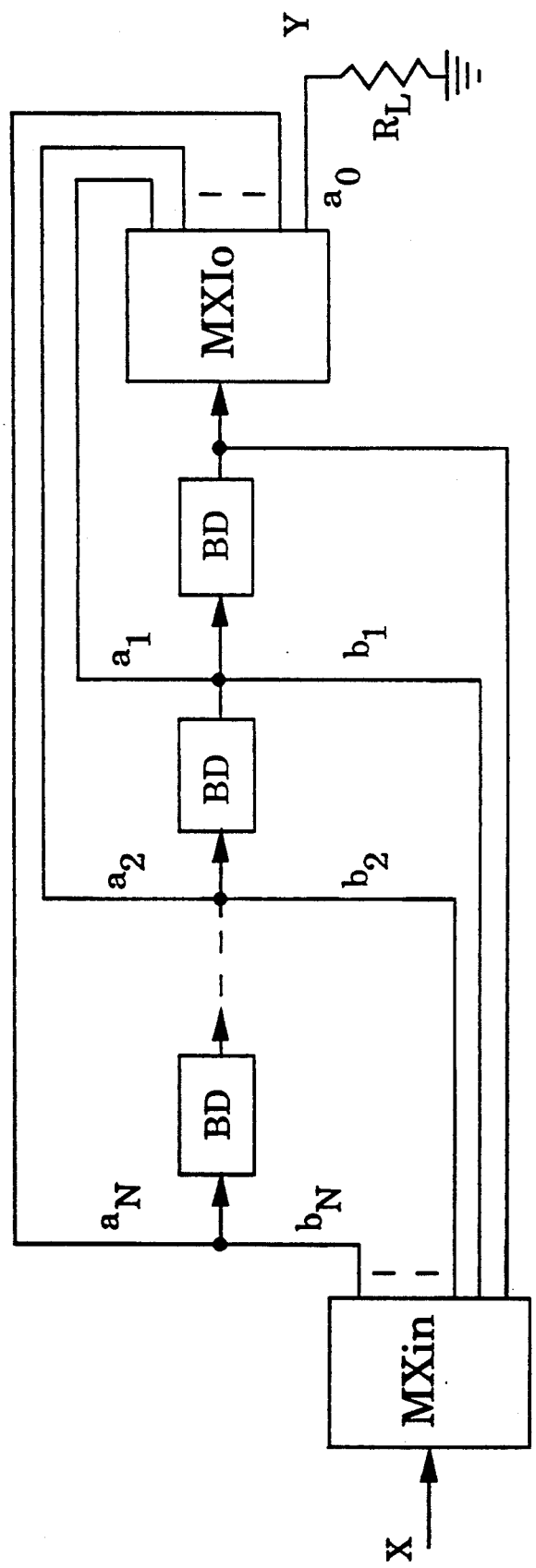
FIG. 6 shows a switched current IIR filter with differentiators as building blocks.

Using these current multiplexers MX3 and differentiators BD1, a general block diagram of FIG. 3 can be implemented as an IIR (recursive) filter as shown in FIG. 6. Since the signals are represented by currents, the addition operation can be accomplished simply by connecting all the currents together, and no extra current adders are needed.

A FIR filter can also be implemented with differentiators and current multipliers. The transfer function of a z-domain FIR filter implemented with $z^{-1}-1$ as the basic elements can be described as $$H(z) = \frac{I_{out}(z)}{I_{in}(z)} = A_k (z^{-1} - 1)^k \tag{5}$$

Figure 7A:
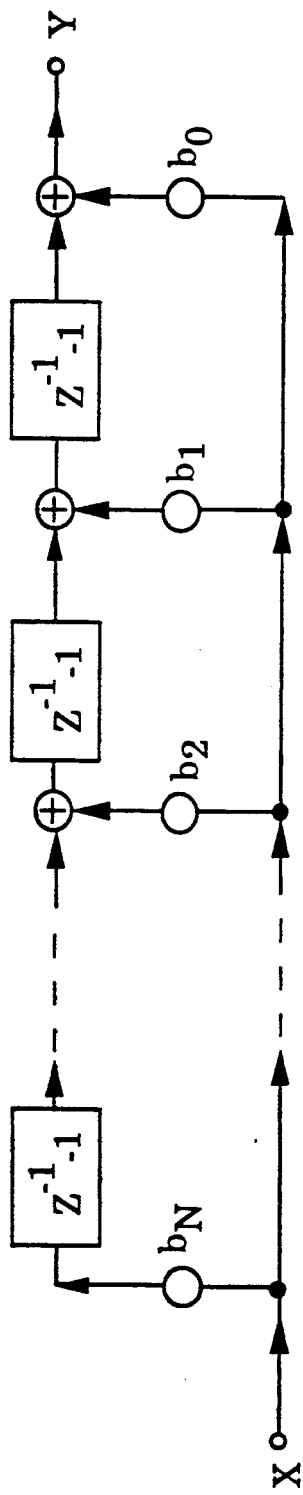
FIG. 7(a) shows the block diagram of a differentiator-based FIR filter.
Figure 7B:
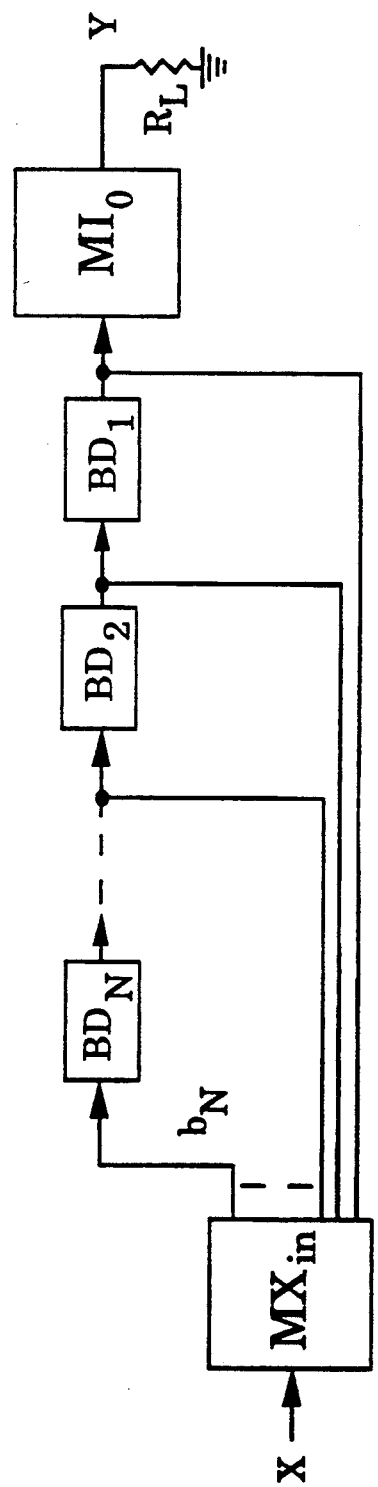
FIG. 7(b) shows a switched current FIR filter circuit with SI differentiators as building blocks.

Since $(z^{-1}-1)$ represents differentiation, the quantity $(z^{-1}-1)^k$ can be obtained by repeatedly differentiating for k times. According to Eq. (5), a block diagram for a general FIR filter is given in FIG. 7(a). Similarly, a circuit configuration for a FIR filter can be constructed by the SI circuits as shown in FIG. 7(b). In this circuit, the input signal is multiplexed to yield different multiplier coefficient b's. The input signal x is multiplied by b0 to feed a current mirror MIo. The input signal x is multiplied by b1 in the multiplexer MXin before reaching the differentiator BD1. The differentiated output of BD1 is summed with bo to feed the current mirror MIo. The signal b2x is differentiated twice by BD1 and BD2 before reaching MXo. After successive differentiation up to n times and summing, one obtains the desired output y. Thus the FIR filter is implemented. By theoretical analysis, it has been found that as soon as the signal frequency is less than fs/6, the sensitivity of the proposed FIR circuit to variations of the multiplier constants is less than that of a circuit with the delay element z.

It is well recognized that second order filters (biquads) are important building blocks for synthesizing high-order filters. Consider a biquad filter with a general s-domain transfer function as follows:

$$H(s) = \frac{I_{out}(s)}{I_{in}(s)} = \frac{As^2 + Bs + C}{Ds^2 + Es + 1} \tag{6}$$

This equation can be represented directly by the state variable diagram shown in FIG. 8(a) in terms of differentiation and scaling. This state variable diagram can be transformed into corresponding SI circuit equivalence as shown in FIG. 8(b). This second order function of s can be rewritten by transposing the terms:

$$CIn + (BIin - EIout)s + (AIin - DIout)s^2 = Iout \tag{7}$$

To implement this equation, the quantity s is implemented by differentiator as explained in Eqn. (1). The quantity $s^2$ is implemented by differentiating s, i.e. double differentiation. The quantities CIn, BIin, AIin are derived from the input current Iin through a current multiplexer MX1 to obtain the appropriate multiplier coefficients A, B, C. The quantities −DIout, −EIout are derived from the output current Iout fed back from another current multiplexer MX2 to obtain the appropriate multiplier coefficients D, E. The quantities DIin and −EIout are summed together as the input current of the first differentiator BD1, where the minus sign indicates subtraction. Thus, the circuit shown in FIG. 8(b) describes the signal flow from the input to the output by summing and differentiating the different quantities in Eqn 7.

Figure 9A:
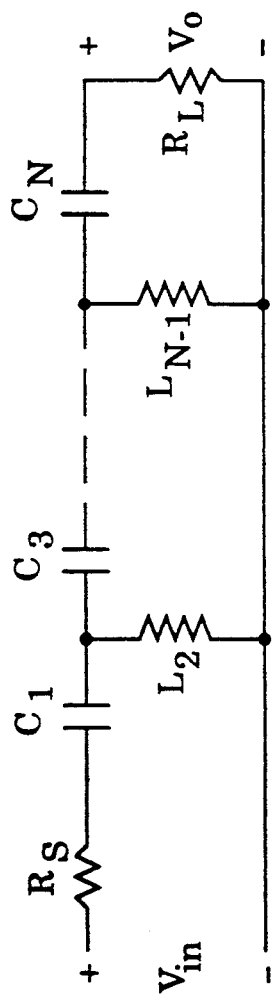
FIG. 9(a) shows a prototype doubly terminated RLC high pass ladder filter.

In the same vein, any higher order transfer function can also be realized by the same method. Take a ladder network with resistance R, inductance L and capacitance C, such as that shown in FIG. 9(a). Such a network can also be realized with the differentiators and multiplexers described earlier. If the input and output parameters are voltages instead of currents, these voltages can first be converted into currents. For instance, the input voltage Vin together with the input resistance R1 in FIG. 9(a) can be changed into a Norton's equivalent circuit with a current source Iin=Vin/R1 and a shunt resistance R1. The output voltage Vout is equal to the output current times the load resistance RL. Thus, a transfer function Vout/Vin is modified to a transfer function Iout/Iin. This current ratio can be expressed as a high order transfer function in frequency domain s.

$$\frac{I_{out}(s)}{I_{in}(s)} = \frac{B_0 + B_1s + B_2s^2 + \ldots B_ns^n}{A_0 + A_1s + A_2s^2 + \ldots A_ms^m} \tag{8}$$

Figure 9B:
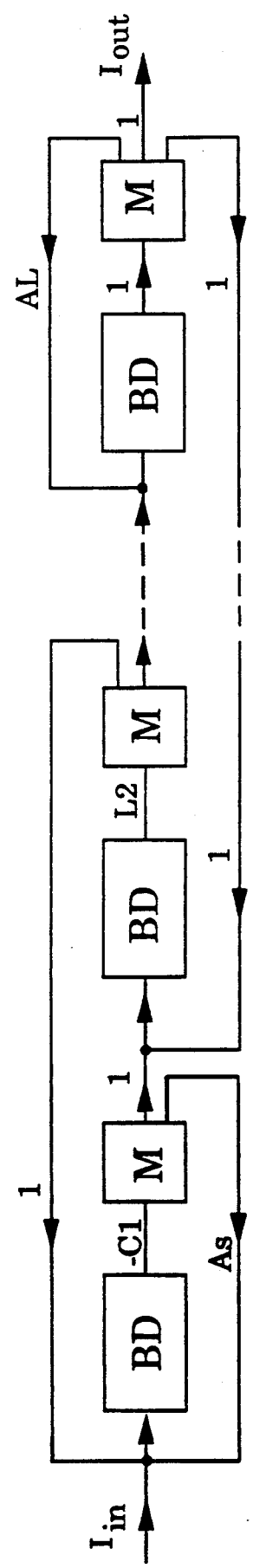
FIG. 9(b) shows the corresponding SI circuit of FIG. 9(a) using SI differentiators.

This high order transfer function can be realized with the same technique as the biquad. The high order s function such as $s^n$ and $s^m$ can be obtained with multiple differentiation using the differentiators of this invention. The coefficients A's and B's can be obtained with the current multiplexers as shown in FIG. 5(b). The circuit shown in FIG. 9(a) can then be realized as shown in FIG. 9(b).

In the foregoing description, cascode current sources are used in the SI differentiators. It should be understood that other types of current sources such as the simple current source illustrated in FIG. 3(b), the Wilson current source, the Widlar current source, etc., well known in the art, can all be used for the present invention. Although only filters such as IIR, FIR, biquads and ladders are illustrated in this description, it should be understood that any time varying transfer function can be implemented by the technique of this invention.

What is claimed is:

1. A differentiator for a discrete time signal processing system comprising:
   an input current terminal;
   an output current terminal;
   a first switched current mirror responsive to a first clock pulse to close a first switch for mirroring said input current as a first mirrored current;
   a second switched current mirror responsive to a second clock pulse, subsequent to and non-overlapping with said first clock pulse to close a second switch for mirroring said first mirrored current as a second mirrored current, thereby delaying said second mirrored current after said input current by said first clock pulse and said second clock pulse;
   a continuous current mirror to mirror said input current as a continuous mirrored current;
   said second mirrored current being subtracted from said continuous mirrored current to obtain a difference current, which is proportional to the derivative of said input current with respect to time.

2. A differentiator for a discrete time signal processing system as described in claim 1, wherein:
   said first switched current mirror comprises:
      an n-channel MOSFET connected as a MOS diode with drain and gate connected together as an input terminal for said input and a first constant current source,
      a first switch with input connected to said drain of said n-channel MOS diode and output connected to the gate of a mirroring n-channel MOSFET,
      the sources of said n-channel MOS diode and said mirroring n-channel MOSFET being connected to a negative power supply;
   said second switched current mirror comprises:

a p-channel MOSFET connected as a p-channel MOS diode with drain and gate connected together as input terminal for said second current mirror from drain current of said mirroring n-channel MOSFET, said second switch responsive to said second clock pulse with input connected to said drain of said first p-channel MOS diode, and with output connected to the gate of a mirroring p-channel MOSFET, the sources of said p-channel MOS diode and said mirroring p-channel MOSFET being connected to a positive power supply, the drain current of said mirroring p-channel MOSFET serving as output current of said second switched current mirror;

said continuous current mirror comprises a second mirroring n-channel MOSFET with gate connected to said drain of said n-channel MOS diode, with source connected to said negative power supply, and with drain connected to said drain of said mirroring p-channel MOSFET.

3. A differentiator for a discrete time signal processing system as described in claim 1, wherein
said first switched current mirror, said second switched current mirror and said continuous current mirror use cascode current sources;
said first current mirror comprises:
a first MOSFET connected as first n-channel MOS diode with drain and gate connected together as an input terminal for said input current and a first constant current source;
a first switch with input connected to said drain of said first n-channel MOS diode and with output connected to the gate of a first mirroring n-channel MOSFET,
a second n-channel MOSFET connected as a second n-channel MOS diode with drain and gate connected together to the source of said first n-channel MOS diode, and with the source of said second diode connected to said negative power supply,
a second switch with input connected to said drain of said second n-channel MOS diode and with output connected to the gate of second mirroring n-channel MOSFET,
the drain of said second mirroring n-channel MOSFET being connected to the source of said first mirroring n-channel MOSFET, the source of said second mirroring n-channel MOSFET being connected to said negative power supply,
the drain of said first mirroring n-channel MOSFET being connected to the input of said second switched current mirror;
said second switched current mirror comprises:
a first p-channel MOSFET connected as a first p-channel MOS diode with drain and gate connected together as input terminal of said second switched current mirror from said drain current of said first mirroring n-channel MOSFET,
a third switch with input connected to said drain of said first p-channel MOS diode and with output connected to the gate of a first mirroring p-channel MOSFET,
a second p-channel MOSFET connected as a second p-channel MOS diode with drain and gate connected together to the source of said first p-channel MOS diode and with the source connected to said positive power,
a fourth switch with input connected to said drain of said second p-channel MOS diode and with output connected to the gate of a second mirroring p-channel MOSFET,
the drain of said second mirroring p-channel MOSFET being connected to the source of said mirroring first p-channel MOSFET,
the source of said second mirroring p-channel MOSFET being connected to said positive power supply;
said continuous current mirror comprises:
a third and a fourth mirroring n-channel MOSFETs,
the gate of said third mirroring n-channel MOSFET being connected to the drain of said first n-channel MOS diode,
the source of said fourth mirroring n-channel MOSFET being connected to said negative power supply,
the gate of said fourth mirroring n-channel MOSFET being connected to the drain of said second n-channel MOS diode,
the source of said third mirroring n-channel MOSFET being connected to the drain of said mirroring fourth n-channel MOSFET,
the drain of said third mirroring n-channel MOSFET being connected to the drain of said first mirroring p-channel MOSFET as an output terminal.

4. A discrete time signal processing system having a differentiator for realizing the transfer function $(z^{-1}-1)$ of said system, an adder, and a coefficient multiplier, said differentiator comprising:
an input current terminal;
an output current terminal;
a first switched current mirror responsive to a first clock pulse to close a first switch for mirroring said input current as a first mirrored current;
a second switched current mirror responsive to a second clock pulse, subsequent to and non-overlapping with said first clock pulse, to close a second switch for mirroring said first mirrored current, thereby delaying said second mirrored current after said input current by said first clock pulse and said second clock pulse;
a continuous current mirror to mirror said input current as a continuous mirrored current;
said second mirrored current being subtracted from said continuous mirrored current to obtain a difference current, which is proportional to the derivative of said input current with respect to time.

5. A discrete time signal processing system as described in claim 4, wherein a current multiplexer functions to obtain said multiplier coefficient,
said multiplexer comprises a multiplicity of n-channel MOSFET current mirrors connected in parallel and fed from a first common input,
one of said parallel current mirrors has output current fed to the input of a complementary current mirror comprising a multiplicity of p-channel MOSFET current mirrors connected in parallel,
said parallel n-channel current mirrors and parallel p-channel current mirrors have individual output currents to provide individual said multiplier coefficients, said MOSFETs in said parallel current mirrors being weighted individually to yield correct value of said multiplier coefficients.

6. A discrete time signal processing system as described in claim 5, wherein all said current mirrors comprise cascode current sources.

7. A discrete time signal processing system as described in claim 4, wherein said system is an infinite impulse response filter to realize the function $$H(z) = \frac{-b_0 + \sum_{k=1}^{N} b_k(z^{-1} - 1)^k}{a_0 - \sum_{k=1}^{N} a_k(z^{-1} - 1)^k}$$

where $a_O$ and $b_O$ are constants and $a_k$ and $b_k$ are said multiplier coefficients.

8. A discrete time signal processing system as described in claim 4, wherein said system is a finite impulse response filter to realize the impulse response function $$H(z) = b_k(z^{-1} - 1)^k$$

where $b_k$ is a said multiplier coeffient.

9. A discrete time signal processing system as described in claim 4, wherein said system is a biquad filter to realize a transfer function in frequency s -domain $$H(s) = \frac{As^2 + Bs + C}{Ds^2 + Es + 1}$$

where s is realized by said differentiator, and A, B, C, D, E are multiplier coefficients realized by said current multiplexers.

10. A discrete time signal processing system as described in claim 4, wherein said system is a ladder filter to realize a transfer function $$H(s) = \frac{A_0 + A_1 s + \ldots A_n s^n}{B_0 + B_1 s + \ldots B_m s^m}$$

where s is realized by said differentiator, and $A_n$ and $B_m$ are multiplier coefficients realized by said current multiplexer.

* * * * *

UNITED STATES PATENT AND TRADEMARK OFFICE
CERTIFICATE OF CORRECTION

PATENT NO. : 5,097,155
DATED : March 17, 1992
INVENTOR(S) : Shen-Iuan LIU, Jing-Shown WU, Hen-Wai TSAO It is certified that error appears in the above-indentified patent and that said Letters Patent is hereby corrected as shown below:

In column 5, line 3, delete equation (5) and insert therefor $$- \quad H(z) = \frac{Iout(z)}{Iin(z)} = Az(z^{-1} - 1)^k \quad -.$$

In column 9, line 24, delete the equation and insert therefor $$- \quad H(z) = \frac{Iout(z)}{Iin(z)} = \sum_{k=0}^{N} b_k (z^{-1} - 1)^k \quad -.$$

Signed and Sealed this

Seventh Day of September, 1993

Attest:

BRUCE LEHMAN

Attesting Officer

Commissioner of Patents and Trademarks